(12) United States Patent
Fartash

(10) Patent No.: US 6,790,775 B2
(45) Date of Patent: Sep. 14, 2004

(54) METHOD OF FORMING A THROUGH-SUBSTRATE INTERCONNECT

(75) Inventor: Arjang Fartash, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/286,060

(22) Filed: Oct. 31, 2002

(65) Prior Publication Data

US 2004/0087126 A1 May 6, 2004

(51) Int. Cl.[7] .............................................. H01L 21/44
(52) U.S. Cl. ................. 438/667; 438/675; 438/456; 257/621; 257/698
(58) Field of Search ................................. 438/597, 667, 438/456, 753, 666, 620, 675; 347/68, 63, 66, 67; 257/621, 684, 698

(56) References Cited

U.S. PATENT DOCUMENTS

| | | | |
|---|---|---|---|
| 5,373,627 A | 12/1994 | Grebe | |
| 5,425,816 A | * 6/1995 | Cavicchi et al. | 136/256 |
| 6,395,632 B1 | 5/2002 | Farrar | |
| 2002/0089572 A1 | * 7/2002 | Lin et al. | 347/68 |
| 2002/0151171 A1 | * 10/2002 | Furusawa | 438/660 |
| 2003/0081073 A1 | * 5/2003 | Chen et al. | 347/63 |
| 2004/0043607 A1 | * 3/2004 | Farnworth et al. | 438/667 |

* cited by examiner

*Primary Examiner*—Caridad Everhart

(57) ABSTRACT

Methods of fabricating a through-substrate interconnect for a microelectronics device, the device including a substrate having a frontside and a backside, are disclosed. Some embodiments of the methods include forming a circuit element on the frontside of the substrate, forming a trench in the backside of the substrate that extends to the circuit element, forming a layer of an insulating polymeric material in the trench, removing sufficient polymeric material from the layer of insulating polymeric material to at least partially expose the circuit element, and forming an electrically conductive interconnect layer in the trench, wherein the interconnect layer is in electrical communication with the circuit element.

52 Claims, 3 Drawing Sheets

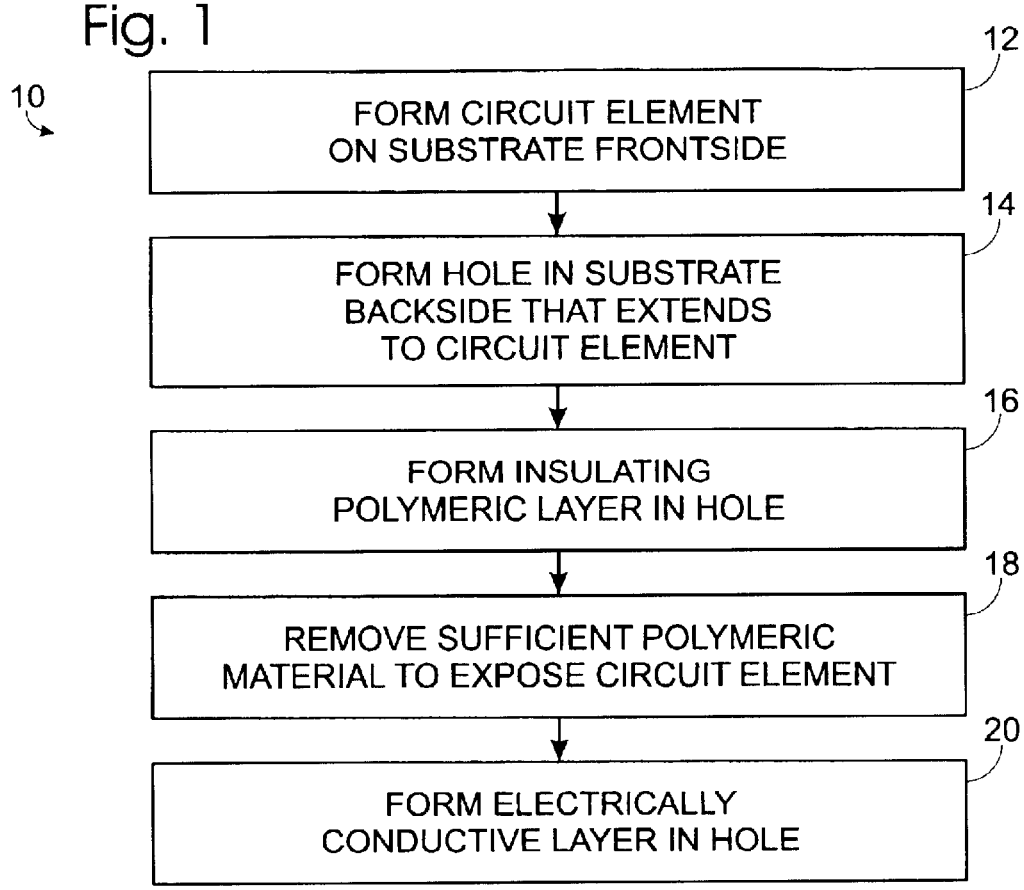
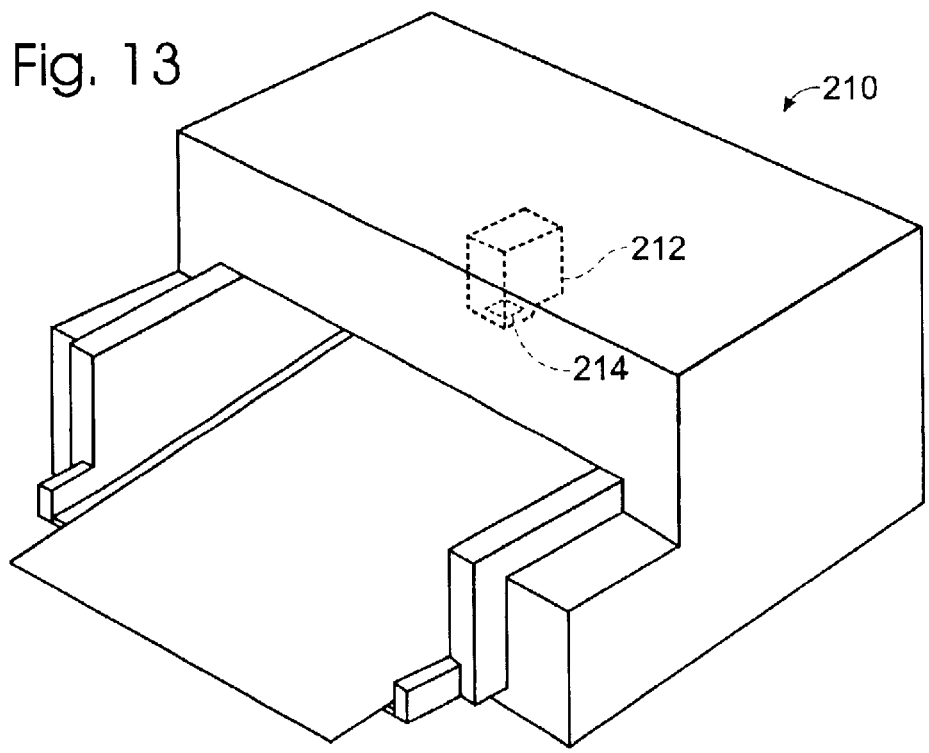

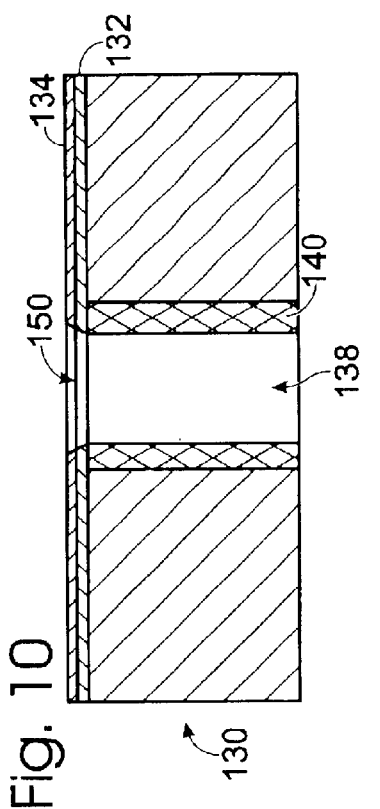
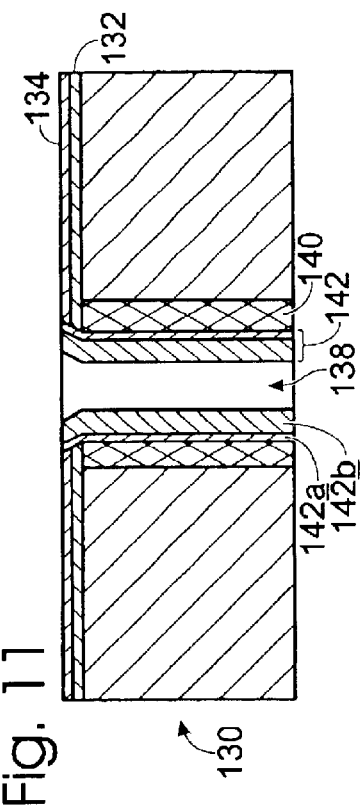
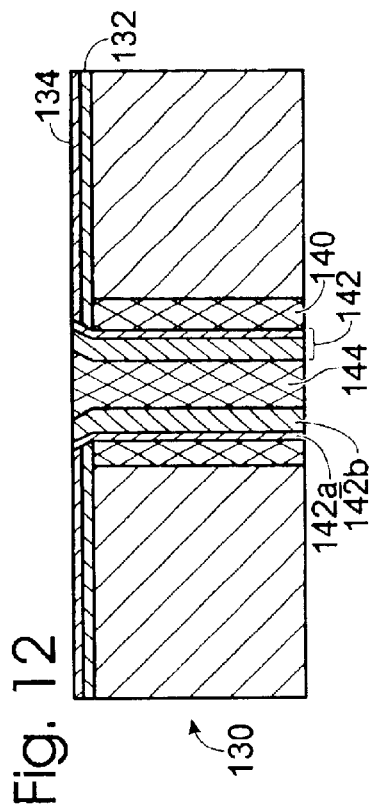
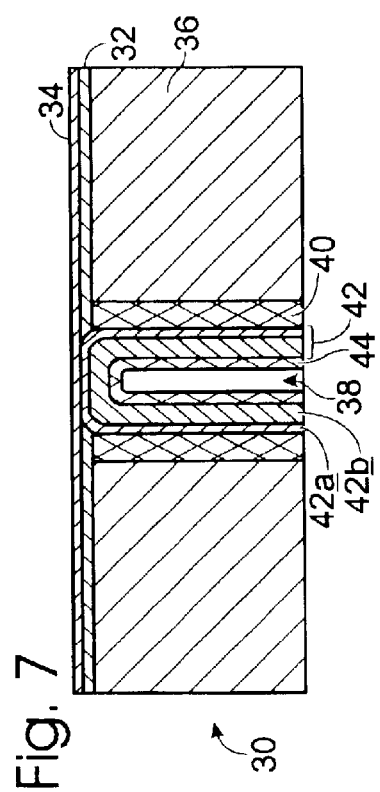
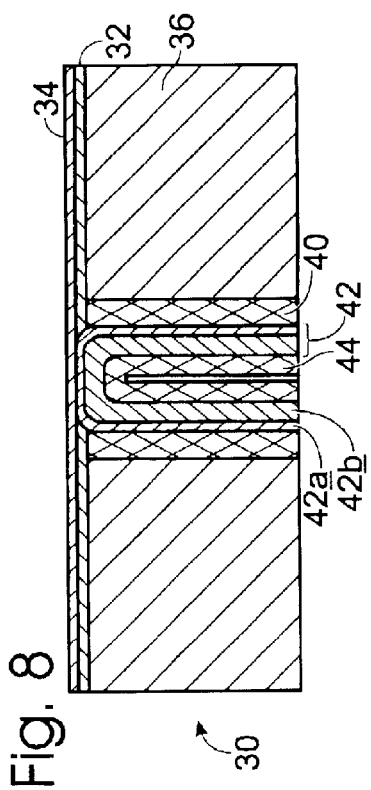
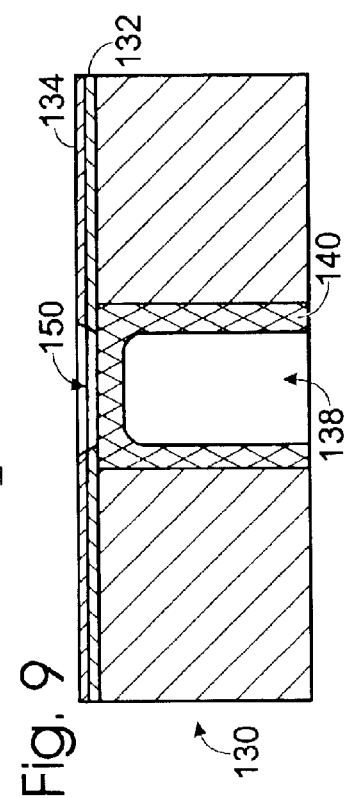

METHOD OF FORMING A THROUGH-SUBSTRATE INTERCONNECT

BACKGROUND

As it becomes possible to fit more and more circuit elements onto a single substrate, a correspondingly larger number of interconnects may be fabricated on the substrate to connect the circuit elements to off-substrate circuitry. Conventional interconnects are often formed on the same side of the substrate as the circuit elements (the "frontside" of the substrate), and terminate at contact pads formed around the perimeter of the substrate frontside. With each increase in the number of circuit elements on a single substrate, the contact pads and interconnects often become more crowded around the perimeter of the substrate. Sometimes the size of the interconnects are reduced to squeeze them into the available space. The reduced interconnect size may lead to various problems, such as a high interconnect resistance caused by the small cross-sectional area of the interconnects, as well as increased manufacturing costs due to the increased miniaturization.

In various specific implementations, the placement of interconnects on the substrate frontside may cause other problems as well. For example, interconnects that connect the firing mechanisms in a printing device printhead die to external circuitry are often formed on the same side of the substrate as the fluid ejection nozzles. Thus, these interconnects may be exposed to printing fluids during printhead use, which may damage the interconnects and lead to the eventual failure of the printheads. Furthermore, due to the thickness of the encapsulent beads used to electrically insulate and protect the interconnects, the printhead may be positioned at such a distance from a printing medium that droplets of printing fluid ejected from the printhead may spread an unfavorable amount before reaching the printing medium. Excessive spreading of printing fluid droplets may make precision printing more difficult.

SUMMARY

Some embodiments provide a method of fabricating a through-substrate interconnect for a microelectronics device, the device including a substrate having a frontside and a backside. The method includes forming a circuit element on the frontside of the substrate, forming a trench in the backside of the substrate that extends to the circuit element, forming a layer of an insulating polymeric material in the trench, removing sufficient polymeric material from the layer of the insulating polymeric material to at least partially expose the circuit element, and forming an electrically conductive interconnect layer in the trench, wherein the interconnect layer is in electrical communication with the circuit element.

BRIEF DESCRIPTION OF THE DRAWINGS

FIG. 1 shows a flow diagram of a first method of forming a through-substrate interconnect according to the present invention.

FIG. 7 shows a sectional view of the substrate of FIG. 6, after partially forming a filler layer over the electrically conductive layer.

FIG. 8 shows a sectional view of the substrate of FIG. 7, after substantially completely forming the filler layer over the electrically conductive layer.

FIG. 9 shows a sectional view of the substrate of FIG. 4, after forming an opening in the circuit element and insulating layer to expose the insulating polymer layer in accordance with another exemplary implementation of the embodiment of FIG. 1.

FIG. 10 shows a sectional view of the substrate of FIG. 9, after removing a portion of the insulating polymer layer.

FIG. 11 shows a sectional view of the substrate of FIG. 10, after forming an electrically conductive interconnect layer over the insulating polymer layer.

FIG. 12 shows a sectional view of the substrate of FIG. 11, after forming a filler layer over the electrically conductive interconnect layer.

FIG. 13 shows a printing device incorporating structure constructed according to an embodiment of the present invention.

DETAILED DESCRIPTION

One embodiment of the present invention is shown generally at 10 in FIG. 1 as a method of forming a through-substrate interconnect for a microelectronics device. Method 10 includes forming, at 12, a circuit element on the frontside of a substrate. Next, method 10 includes forming, at 14, a trench in the substrate from the backside of the substrate that extends far enough into the substrate to expose the circuit element. After forming the trench in the backside of the substrate, at 14, a layer of an insulating polymeric material is formed in the trench at 16. Next, a sufficient amount of the insulating polymeric material is removed, at 18, to expose the circuit element. Finally, an electrically conductive layer is formed in the trench, at 20, such that the electrically conductive interconnect layer is in electrical communication with the circuit element. The electrically conductive interconnect layer formed at 20 may also be electrically connected to a contact pad formed on the backside of the substrate. This allows the contact pad to be connected to a complementary contact formed on the substrate mount (often a fluid ejection head carriage or fluid cartridge). Thus, in this embodiment, there are no external leads connected to the substrate frontside.

A through-substrate interconnect according to the present invention may have other potential uses besides the connection of a circuit element on the front of a substrate to a contact pad on the back of the substrate. For example, the interconnects may also be used to connect circuit elements formed on the back of a substrate to circuit elements formed on the front of the substrate, and thus may allow both sides of the substrate to be used for the fabrication of circuit elements.

The general steps depicted in method 10 may be implemented in any desired manner. A first exemplary implementation of method 10 is depicted in FIGS. 2–8, which show cross-sectional views of a substrate 30 after performing selected steps of the implementation.

Figure 2:
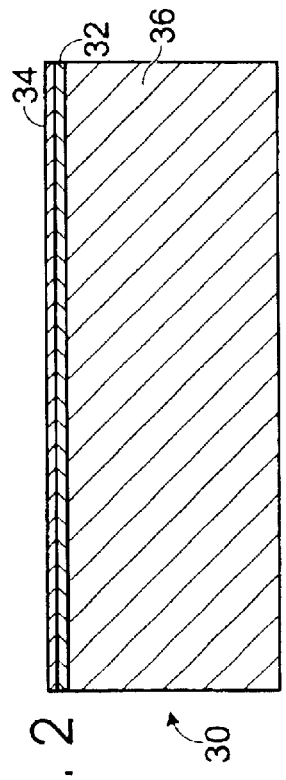
FIG. 2 shows a sectional view of a substrate after forming an insulating layer and a circuit element on the substrate frontside according to a first exemplary implementation of the method of FIG. 1.

Referring to FIG. 2, an insulating layer 32 and an electrically conductive circuit element 34 are first formed on the frontside of substrate 30. Insulating layer 32 electrically insulates circuit element 34 from the substrate bulk 36, and also may serve as a diffusion barrier and gettering layer to prevent material from the circuit element from diffusing into the substrate bulk. An additional diffusion barrier layer (not shown) may be formed either above or below insulating layer 32. Furthermore, insulating layer 32 may also be omitted if desired. Insulating layer 32 may be formed from any suitable insulating material. For example, where substrate 30 is formed from silicon, silicon oxide may be used for insulating layer 32. In some embodiments of the invention, there may be less concern with leakage of current between circuit element 34 and substrate bulk 36, or may be little danger of contamination of the substrate bulk by the material used to form circuit element 34. In these embodiments, circuit element 34 may be formed directly on substrate 30, without the use of insulating layer 32.

Circuit element 34 may take any suitable form. In the embodiment depicted in FIG. 2, circuit element 34 is shown generically as an electrically conductive layer for conducting current to and/or from other circuit elements formed on the substrate frontside. However, it will be appreciated that the circuit element may have a more complex structure, and may be formed from a greater number of individual layers of materials than the depicted single layer of conductor.

Figure 3:
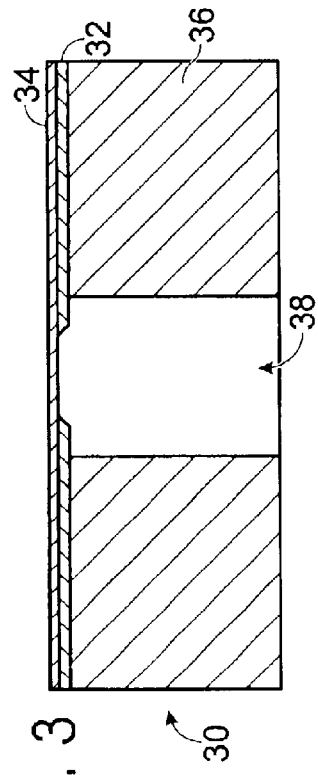
FIG. 3 shows a sectional view of the substrate of FIG. 2, after forming a trench in the substrate backside.

Referring next to FIG. 3, at some later point in the overall device manufacturing process, a trench 38 is formed in the backside of substrate 30 that extends far enough into the backside of substrate 30 to expose insulating layer 32 (or, where the insulating layer is not used, to expose circuit element 34). Any suitable method may be used to form trench 38. Suitable methods include those capable of forming features with relatively high aspect ratios, as the depth of trench 38 may be significantly greater than the width of the trench. Examples of suitable methods include, but are not limited to, laser ablation and deep reactive ion etching.

Figure 4:
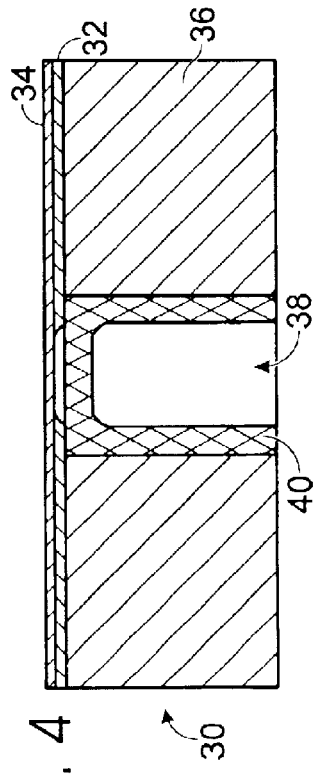
FIG. 4 shows a sectional view of the substrate of FIG. 3, after forming an insulating polymer layer in the trench.

After forming trench 38, the walls of the trench are coated with a suitable insulating polymer layer, shown at 40 in FIG. 4, after forming the trench. Coating the walls of trench 38 with a suitable insulating polymer layer may help to smooth any roughness in the walls of trench 30, and to cover any cracks and/or protrusions.

Suitable insulating polymer materials may include any of a number of desirable physical properties. For example, suitable insulating polymer materials may include those with relatively high dielectric breakdown strengths for their good insulating properties, and/or those with relatively low dielectric constants for avoiding electrical losses in high-frequency applications. Also, suitable polymeric materials may include thermoplastic materials that may be heated after deposition to smooth surface irregularities. This may help to prevent the roughness of the walls of trench 38 from being transferred to the surface of insulating layer 40. Furthermore, suitable polymeric insulating materials may include those deposited via vapor phase reactions, and those deposited at relatively high deposition rates, to facilitate processing substrate 30 in a commercially feasible manner. It will be appreciated that suitable polymeric materials may include any one of these properties, any combination of these properties, and/or any other advantageous physical properties not set forth herein.

One example of a class of suitable polymeric materials is the parylene group of polymers. Parylene polymers are polymers based on poly(p-xylylene), and may be deposited as a film from the solid phase dimer di-p-xylylene by a vapor phase process. Di-p-xylylene is first heated to sublime the dimer, and then pyrolized at a higher temperature to form vapor-phase p-xylylene monomer. The monomer is then transported to a room-temperature deposition chamber containing a substrate, where it adsorbs to the surface of the substrate and polymerizes to form a parylene film. The deposition occurs at only a moderate vacuum, so a conformal, substantially pinhole-free coating of polymer, without shadowing, may be obtained via a relatively fast and simple process in these embodiments. Also, parylene films may be deposited at substantially greater deposition rates than oxide or nitride films. Furthermore, because parylene polymers are thermoplastic, they may be heated after deposition to smooth the surface of the polymer layer. Additionally, parylene films on the order of only a few microns in thickness often have dielectric breakdown voltages on the order of hundreds of volts DC, and have low enough dielectric constants (approximately 2.5 to 3.2) to make them suitable for high-frequency applications. Furthermore, parylene films often grow stress-free and are more compliant than nitride or oxide films, and are thus less susceptible to damage from thermally-induced stresses. Also, because the parylene polymerization reaction may be performed at or near room temperature, there is minimal risk of causing thermal degradation or damage in other device layers during processing in embodiments where room temperature depositions are performed.

Because parylene may bond well to silicon, it may be suitable for use with silicon substrates in some embodiments. Many low-resistance metals, such as silver, copper and aluminum, also may bond well to parylene, allowing a choice of materials for a later-deposited electrically conducting layer. Also, parylene is photo-definable, and may be etched selectively using excimer lasers and/or oxygen plasma etching in some embodiments. Furthermore, parylene polymer films may be hydrophobic and moisture-resistant, and thus may pass little or no leakage current under conditions of high humidity and temperature.

Any suitable parylene polymer may be used to form insulating polymer layer 40. Examples of suitable parylene polymers include, but are not limited to, parylene-N, parylene-C and parylene-D. Also, the parylene layer used to form polymer layer 40 may have any suitable thickness. To achieve a smooth, conformal coating, a parylene film with a thickness of approximately one to four times the magnitude of the defects on the surfaces of trench 38, or even of a greater thickness, may be applied to cover all defects on the trench surfaces. For example, where relatively high etching/ablation rates are used to form trench 38, the walls of the trench may have roughness on a scale of approximately five microns. In this situation, a parylene film with a thickness of approximately fifteen to twenty-five microns may be used, depending upon factors such as the diameter of trench 38. It will be appreciated that insulating parylene layer 40 may have any other suitable thickness, whether thicker or thinner than these dimensions, sufficient to conformally coat and smooth the walls of trench 38.

In some embodiments, parylene layer 40 may be heat-treated briefly by heating to approximately three hundred degrees Celsius to form a smoother surface onto which layers of other materials may be deposited. Heat-treating parylene layer 40 may also cause the formation of an outer diffusion barrier region in the parylene adjacent the surface of the parylene layer. In embodiments where parylene layer 40 is not heat-treated, a diffusion barrier layer (often a metal oxide or nitride) may be deposited before depositing any electrically conductive layers over the parylene to prevent copper from diffusing into underlying materials. However, in embodiments where the parylene layer 40 is heated after deposition, the resulting diffusion barrier layer formed in the surface region of the parylene may provide sufficient protection to allow the step of depositing an additional diffusion barrier layer to be omitted. This is because the outer parylene diffusion barrier region of parylene layer 40 in these embodiments may be impermeable to copper diffusion at temperatures as high as two hundred and fifty degrees Celsius. It will be appreciated that an additional diffusion barrier layer, as shown at 41 in FIG. 5A, may be formed on parylene layer 40 to provide an additional measure of protection against the diffusion of impurities into parylene layer 40 and substrate bulk 36 if desired. Examples of suitable materials for forming additional diffusion barrier layer 41 include, but are not limited to, tantalum, tantalum nitride, titanium, titanium nitride, tantalum/tantalum nitride bilayers, and titanium/titanium nitride bilayers.

Figure 5:
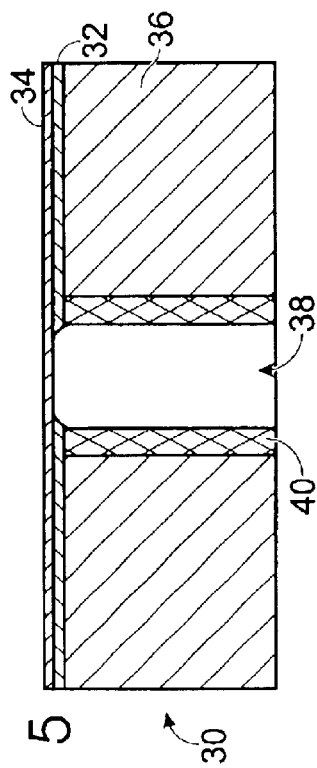
FIG. 5 shows a sectional view of the substrate of FIG. 4, after removing a portion of the insulating polymer layer from the trench.
Figure 5A:
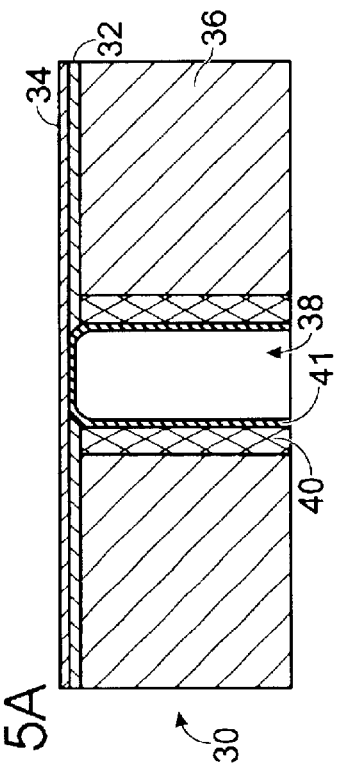
FIG. 5A shows a sectional view of the substrate of FIG. 5, after forming a diffusion barrier layer over the insulating polymer layer according to an alternate implementation of the embodiment of FIG. 1.

After forming the insulating polymer layer 40, at least a portion of the insulating polymer layer 40, and electrically insulating layer 32 adjacent to the portion of the polymer layer may be removed from trench 38 to expose the backside of the circuit element, as shown in the embodiment of FIG. 5. The portion of the polymer layer adjacent circuit element 34 may be removed by any suitable method. Examples of suitable methods include, but are not limited to, laser ablation and oxygen plasma etching. The use of laser ablation to remove the portion of insulating polymer layer 40 adjacent circuit element 34 may allow greater selectivity and precision over oxygen plasma etching in some embodiments.

Figure 6:
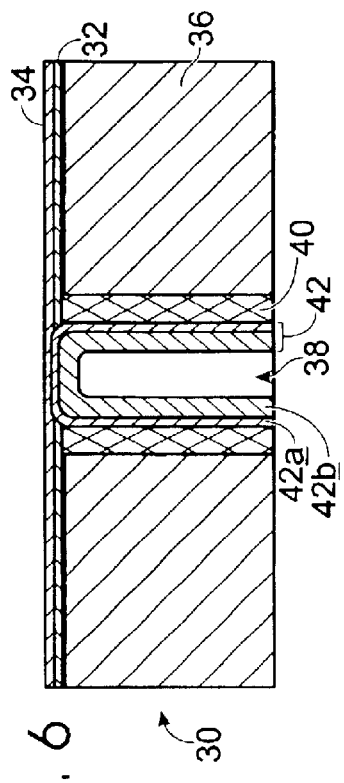
FIG. 6 shows a sectional view of the substrate of FIG. 5, after forming an electrically conductive interconnect layer over the insulating polymer layer.

Referring next to FIG. 6, after removing the portion of insulating polymer layer 40 that is adjacent to circuit element 34, an electrically conductive interconnect layer 42 is formed on the surface of insulating polymer layer 40 and the exposed portion of circuit element 34 to complete an electrically conductive pathway through substrate 30 to the circuit element. The interconnect layer may have any suitable structure. The exemplary electrically conductive layer 42 shown in FIG. 6 includes an electrically conductive seed layer 42a formed on the surface of insulating polymer layer 40, and a somewhat thicker, electrically conductive overlayer 42b formed on the seed layer.

In this embodiment, seed layer 42a is formed in such a manner as to bond strongly to insulating polymer layer 40, and to provide a surface suitable for growing thicker overlayer 42b. Seed layer 42a may be formed from any suitable material. Suitable materials include, but are not limited to, electrically conductive metals such as aluminum, silver, gold and copper.

Seed layer 42a may be formed by any suitable method. Suitable methods include those that form a strong bond between insulating polymer layer 40 and seed layer 42a, and those that may be used to coat high aspect ratio features. One example of a suitable method of forming seed layer 42a is ionized physical vapor deposition (I-PVD). I-PVD is capable of coating features with high aspect ratios, such as trench 38. Furthermore, the use of I-PVD to deposit metals such as aluminum, silver, gold and copper onto parylene may cause the metal layer to adhere strongly to the underlying parylene layer, due to higher impact energy. However, in some embodiments, the I-PVD deposition rates for these materials may be somewhat lower than the rates for other deposition techniques. Therefore, once seed layer 42a has been deposited, thicker overlayer 42b may be deposited via a method with a faster deposition rate. Examples of methods that may be used to form overlayer 42b include electroplating or electroless plating. Overlayer 42b may be formed from any suitable material or materials, and may be formed either from the same material or from different materials as seed layer 42a. Examples of suitable materials for seed layer 42a and overlayer 42b include, but are not limited to, electrically conductive metals such as aluminum, silver, gold and copper.

Once interconnect layer 42 has been formed, trench 38 may be substantially filled with a filler layer, indicated at 44 in FIGS. 7 and 8. Filler layer 44 may be configured to perform any of several functions. For example, filler layer 44 may be used to help to prevent damage to interconnect layer 42 from contaminants or later processing steps. Also, filler layer 44 may help to smooth the backside of substrate 30 by filling any remaining space in trench 38, and thus may facilitate the fabrication of additional structures, such as contact pads or circuit elements, on the substrate backside.

Filler layer 44 may be formed from any suitable material or materials. For example, in some embodiments, filler layer 44 may be formed from an electrically conductive material, such as copper. Forming filler layer 44 of an electrically conductive material may help to increase the amount of current that may be supplied to circuit element 34. Alternatively, filler layer 44 may be formed from an electrically insulating material, such as an oxide or nitride material. Likewise, filler layer 44 may be formed from an insulating polymeric material, such as a parylene polymer. Due to the relatively high rates at which parylene films may be grown, forming filler layer 44 from a parylene polymer may help to decrease the amount of time needed to form the filler layer. Furthermore, because parylene films coat surfaces conformally, the use of a parylene polymer to form filler layer 44 may help to avoid the formation of any voids in filler layer 44.

FIGS. 7–8 illustrate one embodiment of the growth of a parylene filler layer 44. First, FIG. 7 shows a view of a partially-formed filler layer 44. Because parylene deposits on a surface in an even manner, the thickness of the parylene layer increases at a uniform rate on all surfaces of interconnect layer 42, helping to avoid the formation of voids. Growth of filler layer 44 continues evenly in all directions, as shown in FIG. 8, and eventually fills trench 38 essentially completely.

During the formation of filler layer 44, some filler material (not shown) may be deposited on the backside of substrate 30 in the regions surrounding trench 38. In some embodiments, where the filler material is a metal, oxide or nitride, the excess filler material may be removed by a suitable wet or dry etching process. Where the filler material is a parylene polymer, the excess parylene may be removed by mechanical polishing. It will be appreciated that, where the filler material is electrically conductive, it may be desirable to remove as much of the excess filler on the substrate backside as possible to prevent the formation of shorts between adjacent interconnects. However, in embodiments where the filler material is electrically insulating, any filler material remaining on the backside of substrate 30 will not cause shorts to form between adjacent interconnects on the backside of substrate 30.

FIGS. 9–12 show a second exemplary implementation of method 10, in which the portion of the insulating polymer layer adjacent to the circuit element is removed from the substrate frontside, rather than the substrate backside. First, FIG. 9 shows a substrate 130 similar to that of FIG. 4, except that an opening 150 has been formed through an insulating layer 132 and a circuit element 134 on the frontside of the substrate to expose a portion of an insulating polymer layer 140 from the substrate frontside. Opening 150 may be formed in any suitable manner. Examples include, but are not limited to, common wet etching and dry etching processes.

After forming opening 150, the portion of insulating polymer layer 140 that is exposed may then be removed to open a via through substrate 130 from the frontside of the substrate, as shown in FIG. 10. Any suitable method may be used to remove the portion of insulating polymer layer 140 that is adjacent circuit element 134. Examples include oxygen plasma etching and laser ablation.

Once the portion of insulating polymer layer 140 adjacent to circuit element 134 has been removed, an electrically conductive interconnect layer 142 may be formed on the surface of insulating polymer layer 140, as shown in FIG. 11. Interconnect layer 142 may have any suitable structure. The depicted interconnect layer 142 includes a seed layer 142a and a thicker electrically conductive overlayer 142b formed over the seed layer. The materials and forming methods for layers 142a and 142b may be similar to layers 42a and 42b as described above for the implementation of FIGS. 2–8. Interconnect layer 142 contacts circuit element 134 at the edge of opening 150, allowing electrical current to flow from the interconnect layer to the circuit element.

Next referring to FIG. 12, after forming interconnect layer 142, a filler layer 144 may be formed over (or within) interconnect layer 142. As described above for layer 44 of the implementation of FIGS. 2–8, in some embodiments, either a conducting or insulating filler layer 144 may be used, depending upon the electrical characteristics desired for the filler layer. Where an insulating polymer such as parylene is used to form filler layer 144, any excess material that is deposited on the frontside or backside of substrate 130 may be removed by polishing before forming any additional structures on these surfaces.

It will be appreciated that the methods disclosed herein may be used to form a through-substrate interconnect of any suitable dimension and/or aspect ratio relative to other features formed on substrate 30. For example, trench 38 may have a diameter from a few microns to several hundred microns in diameter (typically with an aspect ratio of twenty or less), parylene layer 40 may have a thickness from sub-micron to tens of microns, and electrically conductive layer 42 may have a thickness from sub-micron to tens of microns (or larger to fill the through hole). It will further be appreciated that these ranges are merely exemplary, and that these structures may have dimensions outside of these ranges.

A through-substrate interconnect constructed in accordance with a method of the present invention may be implemented in any of a number of different types of electronic devices, for example, mass storage devices and solid state memory devices. Other examples include detector or emitter arrays, micro-mechanical devices, optical switches, and fluid ejection heads for fluid ejection devices, such as printing devices. An exemplary printing device is shown generally at 210 in FIG. 13, and a fluid ejection cartridge is indicated schematically at 212. While printing device 210 is depicted as a desktop printer, it will be appreciated that a fluid ejection cartridge constructed in accordance with the present invention may also be used in any other printing device, such as a fax machine or a copier. Furthermore, printing device 210 may be any desired size, large- or small-format.

Fluid ejection cartridge 212 includes a fluid ejection head 214 on which a plurality of fluid ejection devices (not shown) are formed. The fluid ejection devices may be configured to eject fluid onto a fluid-receiving medium positioned beneath fluid ejection cartridge 212. As described above, the interconnects of fluid ejection head 214 extend through the substrate to contact pads formed on the back of the substrate. Thus, fluid ejection head 212 may be positioned more closely to a fluid-receiving medium than conventional printheads, and thus allow higher-resolution printing. Also, the interconnects are not exposed to fluids, and thus may have a longer lifetime. Furthermore, because the interconnects allow contact pads to be placed on the backside of fluid ejection head 214, leads that are exposed to fluids are minimized and thus may be less susceptible to failure caused by the contamination of leads by fluids as compared to conventional fluid ejection heads.

Although the present disclosure includes specific embodiments, specific embodiments are not to be considered in a limiting sense, because numerous variations are possible. The subject matter of the present disclosure includes all novel and nonobvious combinations and subcombinations of the various elements, features, functions, and/or properties disclosed herein. The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

What is claimed is:

1. A method of fabricating a through-substrate interconnect for a microelectronics device, the device including a substrate having a frontside and a backside, the method comprising:

forming a circuit element on the frontside of the substrate;

forming a trench in the backside of the substrate that extends to the circuit element;

forming a non-filling layer of an insulating polymeric material in the trench;

removing sufficient polymeric material from the layer of the insulating polymeric material to at least partially expose the circuit element; and forming an electrically conductive interconnect layer in the trench, wherein the electrically conductive interconnect layer is in electrical communication with the circuit element.

2. The method of claim 1, wherein forming the trench in the substrate backside includes forming the trench via a technique selected from the group consisting of laser ablation and deep reactive ion etching.

3. The method of claim 1, wherein the layer of insulating polymeric material is formed by a vapor-phase deposition technique.

4. The method of claim 1, wherein the layer of the insulating polymeric material has a thickness of approximately 20 microns or less.

5. The method of claim 1, wherein removing sufficient polymeric material from the layer of insulating polymeric material to at least partially expose the circuit element includes forming an opening in the circuit element to expose the layer of insulating polymeric material from the substrate frontside, and then removing polymeric material from the substrate frontside.

6. The method of claim 5, wherein removing polymeric material adjacent the opening from the substrate frontside includes removing the polymeric material via laser ablation from the substrate frontside.

7. The method of claim 5, wherein removing polymeric material adjacent the opening from the substrate frontside includes removing polymeric material via oxygen plasma etching.

8. A method of fabricating a through-substrate interconnect for a microelectronics device, the device including a substrate having a frontside and a backside, the method comprising:
   forming a circuit element on the frontside of the substrate;
   forming a trench in the backside of the substrate that extends to the circuit element;
   forming a layer of an insulating polymeric material of parylene in the trench;
   removing sufficient polymeric material from the layer of the insulating polymeric material to at least partially expose the circuit element; and
   forming an electrically conductive interconnect layer in the trench, wherein the electrically conductive interconnect layer is in electrical communication with the circuit element.

9. The method of claim 8, further comprising heating the substrate to approximately 300 degrees Celsius after forming the layer of parylene in the trench to form a diffusion barrier layer in an outer region of the layer of parylene.

10. A method of fabricating a through-substrate interconnect for a microelectronics device, the device including a substrate having a frontside and a backside, the method comprising:
   forming a circuit element on the frontside of the substrate;
   forming a trench in the backside of the substrate that extends to the circuit element;
   forming a layer of an insulating polymeric material in the trench;
   removing sufficient polymeric material from the layer of the insulating polymeric material to at least partially expose the circuit element, including removing polymeric material adjacent the circuit element by laser ablation from the substrate backside; and
   forming an electrically conductive interconnect layer in the trench, wherein the electrically conductive interconnect layer is in electrical communication with the circuit element.

11. A method of fabricating a through-substrate interconnect for a microelectronics device, the device including a substrate having a frontside and a backside, the method comprising:
   forming a circuit element on the frontside of the substrate;
   forming a trench in the backside of the substrate that extends to the circuit element;
   forming a layer of an insulating polymeric material in the trench;
   removing sufficient polymeric material from the layer of the insulating polymeric material to at least partially expose the circuit element;
   forming an electrically conductive interconnect layer in the trench, wherein the electrically conductive interconnect layer is in electrical communication with the circuit element; and
   forming a filler layer in the trench over the electrically conductive interconnect layer.

12. The method of claim 11, wherein the filler layer is formed from parylene.

13. The method of claim 11, wherein the filler layer is formed from an electrically conductive material.

14. A method of fabricating a through-substrate interconnect for a microelectronics device, the device including a substrate having a frontside and a backside, the method comprising:
   forming a circuit element on the frontside of the substrate;
   forming a trench in the backside of the substrate that extends to the circuit element;
   forming a layer of an insulating polymeric material in the trench;
   removing sufficient polymeric material from the layer of the insulating polymeric material to at least partially expose the circuit element; and
   forming an electrically conductive interconnect layer in the trench, wherein the electrically conductive interconnect layer is in electrical communication with the circuit element, and wherein forming the electrically conductive interconnect layer includes first depositing a seed layer, and then depositing a thicker overlayer.

15. The method of claim 14, wherein the seed layer is deposited by ionized physical vapor deposition.

16. The method of claim 14, wherein the overlayer is deposited by electroplating.

17. The method of claim 14, wherein the overlayer is deposited by electroless plating.

18. The method of claim 14, wherein the electrically conductive interconnect layer is formed from copper.

19. A method of fabricating a through-substrate interconnect for a microelectronics device, the device including a substrate having a frontside and a backside, the method comprising:
   forming a circuit element on the frontside of the substrate;
   forming a trench in the backside of the substrate that extends to the circuit element;
   forming a layer of an insulating polymeric material in the trench;
   removing sufficient polymeric material from the layer of the insulating polymeric material to at least partiality expose the circuit element;
   forming an electrically conductive interconnect layer in the trench, wherein the electrically conductive interconnect layer is in electrical communication with the circuit element; and
   forming a diffusion barrier layer over the layer of the insulating polymeric material before forming the interconnect layer.

20. The method of claim 19, wherein the diffusion barrier is formed at least partially of a material selected from the group consisting of tantalum, tantalum nitride, titanium and titanium nitride.

21. A method of fabricating a through-substrate interconnect for a microelectronics device, the device including a substrate having a frontside and a backside, the method comprising:
   forming an electrically conductive circuit element on the substrate frontside;

forming a trench in the substrate backside, the trench including an inner surface, wherein the trench extends to the circuit element;

forming a layer of parylene on the inner surface of the trench such that at least a portion of the circuit element is exposed through the trench; and forming an electrically conductive interconnect layer within the layer of parylene, wherein the interconnect layer is in electrical communication with the circuit element.

22. The method of claim 21, wherein forming a layer of parylene in the trench includes forming a layer of parylene having a thickness of approximately 20 microns or less.

23. The method of claim 22, further comprising heating the substrate to approximately 300 degrees Celsius after forming the layer of parylene in the trench to form a diffusion barrier layer in an outer portion of the layer of parylene.

24. The method of claim 21, wherein forming a layer of parylene on the inner surface of the trench such that at least a portion of the circuit element is exposed includes first depositing a layer of parylene on the inner surface of the trench and then removing a portion of the layer of parylene adjacent to the circuit element by laser ablation from the substrate backside.

25. The method of claim 21, wherein forming a layer of parylene on the inner surface of the trench such that at least a portion of the circuit element is exposed includes first depositing a layer of parylene on the inner surface of the trench, then etching through a portion of the circuit element to form an opening in the circuit element, and then removing parylene adjacent the opening from the substrate frontside.

26. The method of claim 25, wherein removing parylene adjacent the opening from the substrate frontside includes removing the parylene via laser ablation.

27. The method of claim 25, wherein removing parylene adjacent the opening from the substrate frontside includes removing the parylene via oxygen plasma etching.

28. The method of claim 21, further comprising forming a diffusion barrier layer over the parylene layer before forming the interconnect layer.

29. The method of claim 28, wherein the diffusion barrier is formed at least partially of a material selected from the group consisting of tantalum, tantalum nitride, titanium and titanium nitride.

30. The method of claim 29, wherein the diffusion barrier is formed by ionized physical vapor deposition.

31. The method of claim 29, wherein the diffusion barrier includes a bilayer structure selected from the group consisting of tantalum/tantalum nitride and titanium/titanium nitride bilayers.

32. The method of claim 21, wherein forming the trench in the substrate backside includes forming the trench via a technique selected from the group consisting of laser ablation and deep reactive ion etching.

33. The method of claim 21, wherein forming the interconnect layer includes depositing a seed layer by ionized physical vapor deposition, and then depositing an overlayer by a process selected from the group consisting of electroplating and electroless plating.

34. The method of claim 21, wherein the interconnect layer is formed from copper.

35. The method of claim 21, further comprising forming a filler layer over the interconnect layer.

36. The method of claim 35, wherein the filler layer is formed from parylene.

37. The method of claim 35, wherein the filler layer is formed from copper.

38. The method of claim 35, wherein excess parylene is deposited on the wafer backside during the formation of the filler layer, further comprising removing the excess parylene from the wafer backside by mechanical polishing.

39. A microelectronics device, comprising:

a substrate having a frontside, a backside and a bulk region;

a circuit element formed on the frontside of the substrate; and a through-substrate interconnect extending through the bulk region of the substrate from the backside of the substrate to the frontside of the substrate, wherein the through-substrate interconnect includes an electrically conductive interconnect layer separated from the bulk region of the substrate by a polymeric dielectric layer formed by vapor-phase deposition.

40. The microelectronics device of claim 39, wherein the polymeric dielectric layer has a thickness of approximately 20 microns or less.

41. The microelectronics device of claim 39, wherein the interconnect layer is disposed between two polymeric dielectric layers.

42. The microelectronics device of claim 41, wherein the two polymeric dielectric layers are formed from a parylene polymer.

43. The microelectronics device of claim 39, wherein the interconnect layer is at least partially formed from a material selected from the group consisting of copper, silver and aluminum.

44. A microelectronics device, comprising:

a substrate having a frontside, a backside and a bulk region;

a circuit element formed on the frontside of the substrate; and a through-substrate interconnect extending through the bulk region of the substrate from the backside of the substrate to the frontside of the substrate, wherein the through-substrate interconnect includes an electrically conductive interconnect layer separated from the bulk region of the substrate by a polymeric dielectric layer at least partially formed from a parylene polymer.

45. A microelectronics device, comprising:

a substrate having a frontside, a backside and a bulk region;

a circuit element formed on the frontside of the substrate;

a through-substrate interconnect extending through the bulk region of the substrate from the backside of the substrate to the frontside of the substrate, wherein the through-substrate interconnect includes an electrically conductive interconnect layer separated from the bulk region of the substrate by a polymeric dielectric layer and a diffusion barrier layer formed over the polymeric dielectric layer and under the electrically conductive interconnect layer.

46. The microelectronics device of claim 45, wherein the diffusion barrier layer is formed from a material selected from the group consisting of tantalum, tantalum nitride, titanium and titanium nitride.

47. The microelectronics device of claim 45, wherein the diffusion barrier layer is formed in an outer portion of the polymeric dielectric layer.

48. A microelectronics device, comprising:

a substrate having a frontside, a backside and a bulk region;

a circuit element formed on the frontside of the substrate; and a through-substrate interconnect extending through the bulk region of the substrate from the backside of the substrate to the frontside of the substrate, wherein the through-substrate interconnect includes an electrically conductive interconnect layer separated from the bulk region of the substrate by a polymeric dielectric layer, and wherein the interconnect layer includes a seed layer formed on the polymeric dielectric layer and an electrically conductive overlayer formed on the seed layer.

49. A microelectronics device, comprising:

a substrate having a frontside, a backside and a bulk region;

a circuit element formed on the frontside of the substrate; and a through-substrate interconnect extending through the bulk region of the substrate from the backside of the substrate to the frontside of the substrate, wherein the through-substrate interconnect includes an electrically conductive interconnect layer separated from the bulk region of the substrate by a polymeric dielectric layer;

wherein the device is incorporated into a fluid ejection head for a fluid ejection device.

50. A fluid ejection device comprising a fluid ejection head configured to eject a fluid onto a fluid receiving medium, the fluid ejection head including a substrate having a frontside, a backside, and a through-substrate interconnect configured to conduct electrical current through the substrate from the substrate backside to a circuit element formed on the frontside of the substrate, wherein the through-substrate interconnect includes a trench extending through the substrate, a layer of a polymeric dielectric material formed within the trench, and a layer of an electrical conductor formed within the trench over the layer of polymeric dielectric material, the layer of electrical conductor being in electrical communication with the circuit element.

51. The fluid ejection device of claim 50, wherein the polymeric dielectric material is formed from a parylene polymer.

52. The fluid ejection device of claim 50, wherein the layer of the polymeric dielectric material is a first layer of the polymeric dielectric material, further comprising a second layer of the polymeric dielectric material formed within the trench over the layer of electrical conductor.

* * * * *